United States Patent [19]

Adcock

[11] Patent Number: 5,085,015
[45] Date of Patent: Feb. 4, 1992

[54] PROCESS FOR IMPROVING THE SURFACE OF LIQUID CRYSTAL POLYMERS

[75] Inventor: David F. Adcock, Wilmington, Del.

[73] Assignee: E. I. Du Pont de Nemours and Company, Wilmington, Del.

[21] Appl. No.: 543,384

[22] Filed: Jun. 26, 1990

[51] Int. Cl.⁵ .............................. B24B 1/00; B24C 1/00
[52] U.S. Cl. ......................................... 51/319; 51/317; 51/410
[58] Field of Search ............... 51/310, 311, 312, 317, 51/318, 319, 410, 413, 320–321

[56] References Cited

U.S. PATENT DOCUMENTS

| | | | |
|---|---|---|---|
| 3,549,398 | 12/1970 | Watson | 51/319 X |
| 4,232,059 | 11/1980 | Proffitt | 51/319 X |
| 4,343,838 | 8/1982 | Baker | 51/319 X |
| 4,735,679 | 4/1988 | Lasky | 51/317 X |
| 4,738,056 | 4/1988 | Suzuki | 51/413 |

FOREIGN PATENT DOCUMENTS 1294875  11/1989  Japan ..................... 51/310

*Primary Examiner*—Bruce M. Kisliuk
*Assistant Examiner*—John A. Marlott
*Attorney, Agent, or Firm*—Paul R. Steyermark

[57] ABSTRACT

Surfaces of articles molded from unfilled or lightly filled liquid crystal polymers have a tendency to peel away when subjected to even slight rubbing. Such surfaces are improved by subjecting them to abrasion to remove at least 0.01 mm of surface thickness, whereby they acquire a smooth matte finish and are no longer susceptible to peeling.

17 Claims, No Drawings

PROCESS FOR IMPROVING THE SURFACE OF LIQUID CRYSTAL POLYMERS

BACKGROUND OF THE INVENTION

This invention relates to a process for improving the surface of articles made from unfilled or lightly filled liquid crystal polymers (sometimes referred to hereinafter as LCPs).

LCPs are well know to the art. These are usually anisotropic esters of aromatic diols such as, for example, resorcinol, hydroquinone, Bisphenol A, etc. with an aromatic dicarboxylic acid such as, for example, terephthalic and isophthalic acid. Normally, either two different diols or two different dicarboxylic acids are used to make such esters; and frequently a hydroxycarboxylic acid such as, for example 4-hydroxybenzoic acid, is copolymerized with those starting materials. Typical LCPs are described in U.S. Pat. Nos. 4,664,972 to Connolly; 4,242,496 to Jackson et al. and 4,360,658 to Jackson et al.

LCPs are important engineering polymers, characterized by excellent mechanical properties, especially high tensile strength, modulus, and heat deflection temperature, and are readily melt-processable at about 300°–400° C. They are particularly suitable for the manufacture of articles such as various structural/mechanical components and electrical/electronic parts. Typical applications of LCPs include, for example, circuit boards, electronic connectors, and high temperature, under the hood uses for automobiles.

In spite of all these valuable properties, melt fabricated (i.e., extruded and molded) articles made from unfilled and lightly filled LCPs have a serious drawback in that their surface layer is very susceptible to abrasion, even when the abrasive force is very slight. In the context of the present disclosure, the expression "lightly filled" means that the LCP composition contains a small amount, usually not over about 5 percent by weight, of fillers. Such melt fabricated articles are characterized by having a shiny surface. Peeling of the surface layer occurs very readily when it is rubbed or subjected to friction. When the surface of a molded LCP article tends to peel, surface finish such as painting or coating is very sensitive to damage. If an LCP surface is bonded to another surface, the bonded surfaces tend to delaminate. A commonplace problem occurs in electronic applications when the LCP article is a substrate for a circuit board, which must be copper-plated. The copper-plated surface together with the top layer of "peelable" LCP delaminates from the LCP substrate, resulting in a poor mechanical or electrical contact.

It, therefore, has been appreciated for a long time that an improvement of the surfaces of melt fabricated LCP articles was needed, but no process has been disclosed to the art that actually explained and solved the problem.

SUMMARY OF THE INVENTION

According to this invention, there is now provided a process for improving the surface of an article melt fabricated from a composition consisting essentially of a liquid crystal polymer and 0 to about 5 percent by weight, based on the weight of the liquid crystal polymer, of filler material, wherein the surface to be improved is subjected to abrasion so as to remove at least about 0.01 mm, preferably at least about 0.025 mm, and especially at least about 0.05 mm of the surface thickness, whereby the surface acquires a smooth, matte finish and is no longer susceptible to peeling.

DETAILED DESCRIPTION OF THE INVENTION

Definition

For the purpose of the present disclosure, the term "unfilled" means that the polymer does not contain any solid filler materials. Liquid crystal polymer containing a material that normally is liquid at ambient temperature, such as a plasticizer, or at the LCP's processing temperature, such as a monomeric or polymeric additive that may be present in a small amount as a processing aid, in any event is not a filler material.

Filler materials (or fillers) are normally understood to be solid materials that are compounded with a polymer to modify or improve the polymer's properties. Normally, fillers are, but do not have to be, inorganic and include such representative materials as, for example, calcium carbonate, barium sulfate, glass fibers, carbon, titanium dioxide, talc, and various pigments.

For the purpose of the present disclosure and claims, the term "consisting essentially of" means that, in addition to the liquid crystal polymer and any filler present, the composition may also contain smaller amounts of other ingredients that do not detract from the operability of the invention. Such additional ingredients may be, for example, plasticizers, melt processing aids, stabilizers, antioxidants, and pigments other than those used as fillers.

The preferred method of achieving suitable abrasion of the surface is by means of a stream of abrasive particles. Those particles may be propelled by any suitable fluid, but most commonly will be air-propelled. Other suitable fluids include water, steam, gases other than air (for example, nitrogen), oil, etc. Essentially, then, the process of the present invention involves well known operations such as, for example, sand-blasting or grit-blasting, but a variety of abrasive particles may be used. The smooth matte finish, which is obtained as a result of the abrasion of the peelable layer, can be readily seen by visual observation, although this could be a somewhat subjective test depending on an individual's visual acuity. However, any convenient instrumental method of determining when the initial shiny surface completely disappears and is replaced by a matte surface can be employed, if desired. In any event, when a sufficient thickness of the LCP surface has been removed, as recited in the Summary of the Invention, the result is generally satisfactory. Removing significantly more of an article's thickness than required for producing the matte surface normally is undesirable because this could change the article's dimensions to an unacceptable degree. This, nevertheless, would not impair the operability of this invention. It was found in an experiment that a nonpeelable surface was obtained after the removal of a thickness of only 0.01 mm, and the fresh surface remained nonpeelable as successive thicknesses of material were removed, until the test was stopped at 0.14 mm of thickness removed.

It is completely unexpected that the surfaces which have been abraded according to the process of this invention no longer peel. In other words, one would normally expect that the tendency of LCP surfaces to peel is inherent to LCP, irrespective of whether or not the surface has undergone any particular treatment, and would persist even as one reaches deeper into the LCP material. Yet, contrary to such expectations, the newly exposed surfaces no longer peel, so that the improvement achieved by this process is permanent.

The required propellant pressure depends on the inherent hardness of the LCP material, the harder the material the higher the pressure required to impart to the surface the desired finish. Of course, the same desired result usually can also be achieved at lower pressures, but this will require longer time. However, use of high pressure when working with a soft LCP would tend to severely abrade the fabricated article and would remove some core material. At the desired level of surface abrasion, the basic dimension of the fabricated article is, for all practical purposes, unchanged, so that the article can perform satisfactorily in its intended applications.

Normally, this abrasion process will be carried out at ambient temperature, although an elevated temperature can be used, so long as it is lower than the softening point of LCP.

The abrasive particles can be any particles that are sufficiently hard to be able to abrade the LCP surface when propelled by the chosen fluid. The smaller the particle, the smoother will be the resulting surface after treatment. In addition to sand, other typical abrasive materials suitable in this process include glass beads, powdered stone or marble, powdered bones, and any other particulate material capable of achieving uniform and controlled abrasion. The preferred particle size of those materials will depend, among others, on the inherent hardness of such particles as well as on the inherent hardness of the particular LCP material, the harder the LCP surface, preferably the harder also the abrasive particles. The usual particle size normally will be about 50–200 mesh (0.297–0.074 mm), preferably 70–100 mesh (0.210–0.149 mm), but these ranges are not critical. One would normally be guided by the totality of the parameters, including the hardness of the LCP surfaces to be treated, the hardness of the abrasive particles, the propellant pressure, and the time required to achieve the desired result. The optimum combination of parameters can be readily ascertained by one skilled in the art by making two or three trial runs. It has been found that glass beads, size "801-208", sold by Zero Blast-n-Peen Corporation, Washington, Mo., are an excellent abrasive material for this purpose. The actual particle size of these glass beads is about 70–100 mesh (0.210–0.149 mm).

One of the industrially most important applications contemplated by this invention would be the preparation of LCP substrates for the manufacture of electronic components such as, e.g., circuit boards and the like, where a conductive layer (usually, a metal layer) is bonded to the substrate. Grit blasting of the LCP substrate would lead to improved bonding of the conductive layer to the LCP substrate, thus improving the electical contacts and extending the useful life of the component.

This invention is now illustrated by representative examples of certain preferred embodiments thereof. In each example, the amount of surface thickness removed by abrasion was about 0.05 mm.

EXAMPLE 1

Automobile fenders, one-quarter of actual size, were molded on a 200 ton Van Dorn injection molding machine from LCPI made by condensation of 26.7 mole % of t-butylhydroquinone and 6.7 mole % of 4,4'-biphenol with 33.3 mole % of terephthalic acid and 33.3 mole % of p-hydroxybenzoic acid, as described in Example 2C of Connolly U.S. Pat. No. 4,664,972. A fender was selected and grit-blasted in a Zero brand Blast-n-Peen machine with size "801-208" glass beads propelled by compressed air at a pressure of 552 kPa. The original glossy finish was uniformly removed, and a smooth matte finish remained. There was no peeling or delamination of the top layer when rubbed with a finger, which was the case with fenders that had not been blasted with an abrasive material. The abrasive-blasted fender could be painted very well with an acrylic spray enamel to a uniformly finished part. By contrast, untreated fenders had oily sections, where paint adhered poorly. The spray enamel contained 85% by weight of volatiles as follows:

| | |
|---|---|
| ketones, esters, and alcohols | 15% |
| aromatic and aliphatic hydrocarbons | 16% |
| methylene chloride | 27% |
| aliphatic hydrocarbon propellant | 27%. |

EXAMPLE 2

Two tensile bars, 1.25×0.3×16.5 cm, injection-molded of a commercial LCP sold by Celanese Corporation under the name Vectra ® A900 were blasted in the same machine with the same type of glass beads as in Example 1. The air pressure in this case had to be reduced to 414 kPa because of the softer surface of this particular LCP. A good nonpeelable matte finish was easily achieved in this case.

EXAMPLE 3

Two 12.5×12.5 cm plaques injection-molded from LCP2 made from 20 mole % of t-butylhydroquinone, 5 mole % of Bisphenol A, 25 mole % of terephthalic acid, and 50 mole % of p-hydroxybenzoic acid, as described ion Example 4C of U.S. Pat. No. 4,664,972, were blasted in the same equipment and under the same conditions as described above in Example 1 in such a way that only the surface of the bottom half of one plaque and the surface of the right half of the other plaque were blasted; the remaining halves of those plaques were left untreated. It is noted that, while these were rectangular plaques, each plaque had some gate or sprue polymer attached to one edge, considered the top, so that the bottom half and the right half were distinct from the top half and the left half.

Two 1.88 cm-wide pieces of adhesive tape (Scotch Magic Tape No. 810, 3M Corp.) were applied to each plaque in the molding machine direction. One piece was applied to the untreated side and one was applied to the abrasive-treated side by rolling three times with a 2.27 kg roller. Five minutes later, the tape was peeled off by hand at an approximate rate of 2.5 cm/second. The blasted side of each plaque showed no visible effect of the tape removal, but the surface of the untreated side of each plaque was severely damaged.

The same procedure was repeated with a 2.5 cm-wide masking tape (Permacel, New Brunswick, N.J.). The results were similar, but the damage to the untreated surfaces was less severe.

EXAMPLE 4

Ten 1.56×63×65.6 mm flex bars were injection molded from each one of LCP3 and LCP4, which had the following compositions (in mole %).

LCP3: 31.7% of t-butylhydroquinone, 1.7% of Bisphenol A, 33.3% of terephthalic acid, and 33.3% of p-hydroxybenzoic acid.

LCP4: 47.5% of phenylhydroquinone, 47.5% of terephthalic acid, and 5% of p-hydroxybenzoic acid.

Five bars from each series were blasted with glass beads as described in Example 1, while the remaining five were left untreated. The physical properties of those bars were determined according to ASTM Standard D-790. The following results were obtained.

|  | As Made | | Grit Blasted | |
| --- | --- | --- | --- | --- |
|  | LCP3 | LCP4 | LCP3 | LCP4 |
| Flexural modulus, MPa | 14.4 ± 0.4 | 13.0 ± 0.4 | 14.0 ± 0.4 | 12.6 ± 0.2 |
| Flexural strength, kPa | 252.3 ± 14 | 215.1 ± 14 | 234.4 ± 6 | 207.5 ± 5 |
| Flexural elongation at break, % | 2.7 ± 0.3 | 2.1 ± 0.2 | 2.5 ± 0.2 | 2.2 ± 0.1 |

The above results show that the mechanical properties of the grit-blasted LCP test bars were very close to those of the untreated test bars, so that one can safely conclude that removing the peelable LCP layer does not adversely affect the mechanical properties of articles subjected to this treatment.

I claim:

1. A process for improving the surface of an article melt fabricated from a composition consisting essentially of a liquid crystal polymer and 0 to about 5 weight percent of filler, based on the weight of the liquid crystal polymer, wherein the surface to be improved, which is initially susceptible to peeling, is subjected to abrasion so as to remove at least about 0.01 mm of the surface thickness, whereby the surface acquires a smooth, matte finish and is no longer susceptible to peeling.

2. The process of claim 1 wherein the surface thickness removed by abrasion is at least 0.025 mm.

3. The process of claim 1 wherein the surface thickness removed by abrasion is at least 0.05 mm.

4. The process of claim 1 which is accomplished by blasting with abrasive particles.

5. The process of claim 2 which is accomplished by blasting with abrasive particles.

6. The process of claim 4 where the abrasive particles have an average size of about 0.297 to 0.074 mm.

7. The process of claim 5 where the abrasive particles have an average size of about 0.297 to 0.074 mm.

8. The process of claim 6 where the abrasive particles have an average size of 0.210–0.149 mm.

9. The process of claim 7 where the abrasive particles have an average size of 0.210–0.149 mm.

10. The process of claim 1 wherein the article is the substrate to which a conductive coating is to be applied, the coated substrate to serve as an electronic component.

11. The process of claim 2 wherein the article is the substrate to which a conductive coating is to be applied, the coated substrate to serve as an electronic component.

12. The process of claim 10 wherein the electronic component is a circuit board.

13. The process of claim 11 wherein the electronic component is a circuit board.

14. The process of claim 4 wherein the liquid crystal polymer article is the substrate to which a conductive coating is to be applied, the coated substrate to serve as an electronic component.

15. The process of claim 5 wherein the article is the substrate to which a conductive coating is to be applied, the coated substrate to serve as an electronic component.

16. The process of claim 14 wherein the electronic component is a circuit board.

17. The process of claim 15 wherein the electronic component is a circuit board.

* * * * *